(12) United States Patent
Ng et al.

(10) Patent No.: US 7,327,054 B2
(45) Date of Patent: Feb. 5, 2008

(54) LINEAR ACTUATOR COMPRISING VELOCITY SENSOR

(75) Inventors: Hon Yu Peter Ng, Singapore (SG); You Yong Liao, Singapore (SG); Gary Peter Widdowson, Hong Kong (CN); Ajit Gaunekar, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 61 days.

(21) Appl. No.: 11/089,786

(22) Filed: Mar. 25, 2005

(65) Prior Publication Data
US 2006/0214517 A1   Sep. 28, 2006

(51) Int. Cl.
*H02K 41/00* (2006.01)
*H02K 41/35* (2006.01)
*H02K 7/00* (2006.01)

(52) U.S. Cl. .............................. 310/12; 310/14; 310/15; 310/19

(58) Field of Classification Search ............ 310/12–14, 310/15–19; 720/666, 667; 318/432
See application file for complete search history.

(56) References Cited

U.S. PATENT DOCUMENTS 4,583,212 A * 4/1986 Koide et al. ................ 720/666
4,792,707 A * 12/1988 Katanuma ..................... 310/12
6,362,586 B1 * 3/2002 Naidu ........................ 318/432
7,030,519 B2 * 4/2006 Slettenmark ................. 310/12
7,101,141 B2 * 9/2006 Rezaei ................... 414/416.01

FOREIGN PATENT DOCUMENTS

JP         356142608 A  * 11/1981  .................. 310/12

* cited by examiner

*Primary Examiner*—Tran Nguyen
(74) *Attorney, Agent, or Firm*—Ostrolenk, Faber, Gerb & Soffen, LLP

(57) ABSTRACT

A linear actuator for a motion system is provided with a velocity sensor for monitoring a velocity of an actuation arm that it is driving. The linear actuator comprises a magnetic field, a first coil that is controllably movable within the magnetic field by adjusting a current flowing through the first coil whereby to drive the actuation arm and a second coil that is movable with the first coil and configured such that a voltage is inducible in the second coil that is proportional to its velocity. A controller device is connected to the second coil for receiving feedback indicating the voltage induced in the second coil whereby a velocity of the actuation arm is determinable, wherein the controller device is further connected to the first coil and is operative to adjust the current flowing in the first coil based upon said feedback for controllably driving the actuation arm.

13 Claims, 4 Drawing Sheets

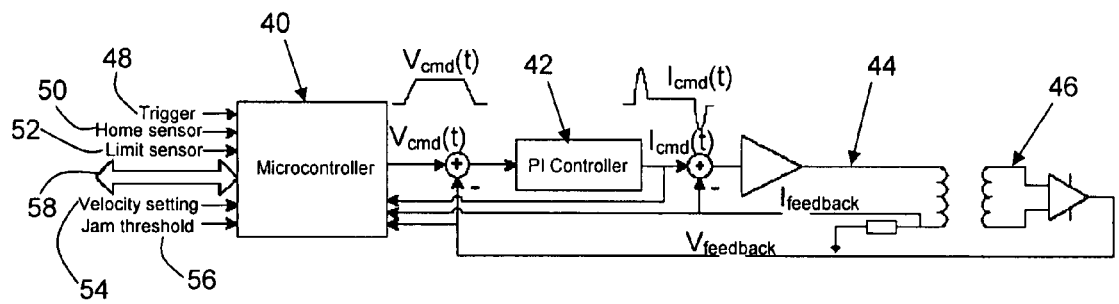
FIG. 5
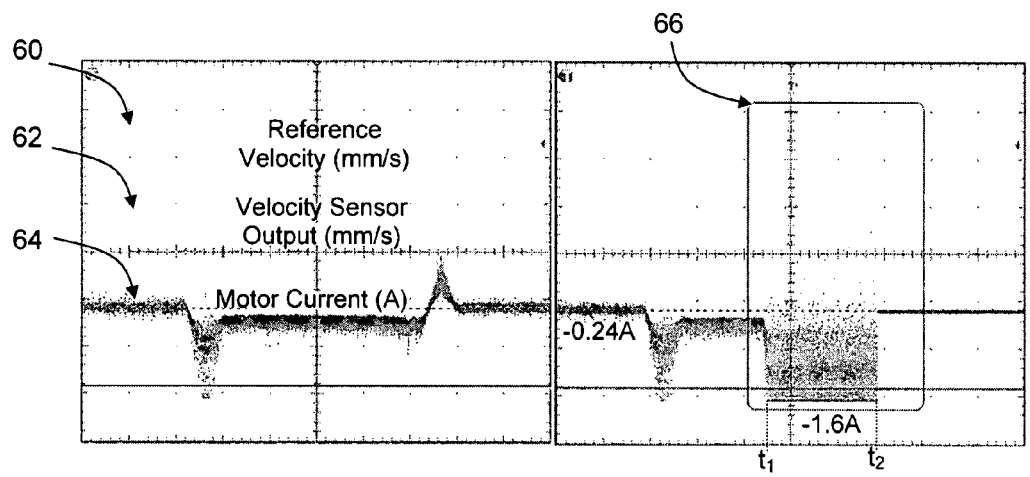
FIG. 6(a)  FIG. 6(b)

LINEAR ACTUATOR COMPRISING VELOCITY SENSOR

FIELD OF THE INVENTION

The invention relates to a linear actuator of a motion system for driving an actuation arm, and in particular to a linear actuator that is fitted with a velocity sensor For monitoring the velocity of the actuation arm that is being driven.

BACKGROUND AND PRIOR ART

Ejector systems are used in the semiconductor industry for a variety of purposes. One use is in the area of automatically transferring a semiconductor substrate onto a work-holder for processing. For example, such an ejector system is used to automatically transfer substrates from their containers to wire bonding machines that make wire connections between electronic components attached on the substrate and electrical connection pads on the substrate.

More specifically, in a typical wire bonding machine, an ejector system is used to eject substrates (commonly in the form of leadframes) from a magazine onto a work-holder channel. The substrates are pushed one at a time onto the work-holder and held in position by clamping devices. Thereafter, a bonding tool performs wire bonding on the substrates on the work-holder while the substrates are being held by the clamping devices. An indexing system associated with the clamping device is responsible for precisely indexing the substrate and presenting it to the bonding tool. The bonding tool makes interconnections between the connection pads (such as leads) of the substrate and connection pads on the semiconductor device mounted on the substrate.

Conventionally, the ejector system comprises an ejector arm that is driven by a traction drive using a DC motor. A prior art ejector system 100 is illustrated in FIG. 1. The ejector system 100 has an ejector arm 102 to push a leadframe 104 into a work-holder channel (not shown). The ejector arm 102 is driven towards the leadframe 104 by frictional force from rubber rollers 106 pressing on the ejector arm 102. The rubber rollers 106 are mounted directly on a motor shaft 108 of a geared DC motor (not shown). Deep-grooved ball bearings 110 are positioned along the route of motion of the ejector arm 102 to provide smooth and precise linear motion to it. At least one of the ball bearings 110 is mounted on a preload arm 114. A spring 112 is coupled to the preload arm 114 to apply a certain preload on the preload arm 114 and the at least one ball bearing 110 to maintain steady and stable movement of the ejector arm 102. System initialization and motion control are achieved through a home sensor 116 and a limit sensor 118 positioned adjacent to the ejector arm 102.

Due to variation of friction between the leadframe 104 and the magazine or misalignment between the leadframe 104 and the work-holder channel, it is possible for jamming of the leadframe 104 in the magazine or work-holder channel to occur. Thus, a jam detecting sensor 120 is placed just above the leadframe 104 to sense any lateral deformation of the leadframe 104 that would occur during jamming of the leadframe 104. Jam detection is important because semiconductor substrates are generally fragile and vulnerable, and excessive external forces acting on their components during a jam can result in damage.

There are certain drawbacks in this conventional design. Since it adopts a traction drive mechanism, its reliability and lifespan are limited by premature wear. Also, the thrust force is generally non-programmable and uncontrollable for different types of leadframes. A similar thrust force would therefore lead to different impacts on leadframes that comprise different materials, thicknesses and widths. Even with stringent control over manufacturing tolerance and assembly, force consistency is difficult to achieve for the above reason. Further, jam detection and protection capability depends considerably on the sensitivity of the jam detecting sensor 120. Especially for thick leadframes, the deformation in the leadframes may be small, making it very difficult to sense deformations in the leadframes if they are jammed. Finally, this jam sensing module entails significant additional cost, which is likely to be even higher than the cost of the ejector system itself.

SUMMARY OF THE INVENTION

It is therefore an object of the invention to provide an improved linear actuator that avoids some of the disadvantages of the prior art linear actuator systems, and offers a more effective and cost-efficient mechanism that allows jam detection.

Accordingly, the invention provides a linear actuator for driving an actuation arm comprising: a magnetic field; a first coil that is controllably movable within the magnetic field by adjusting a current flowing through the first coil whereby to drive the actuation arm; a second coil that is movable with the first coil and configured such that a voltage is inducible in the second coil that is proportional to its velocity; and a controller device connected to the second coil for receiving feedback indicating the voltage induced in the second coil whereby a velocity of the actuation arm is determinable, wherein the controller device is further connected to the first coil and is operative to adjust the current flowing in the first coil based upon said feedback for controllably driving the actuation arm.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a linear actuator in accordance with the invention incorporated in an ejector system will now be described with reference to the accompanying drawings, in which:

FIG. 5 is a schematic control diagram showing a control system for the linear actuator; and FIG. 6 is a graphical illustration of a jam detection and leadframe protection process of the ejector system of FIG. 2.

DETAILED DESCRIPTION OF THE PREFERRED EMBODIMENT OF THE INVENTION

Figure 1:
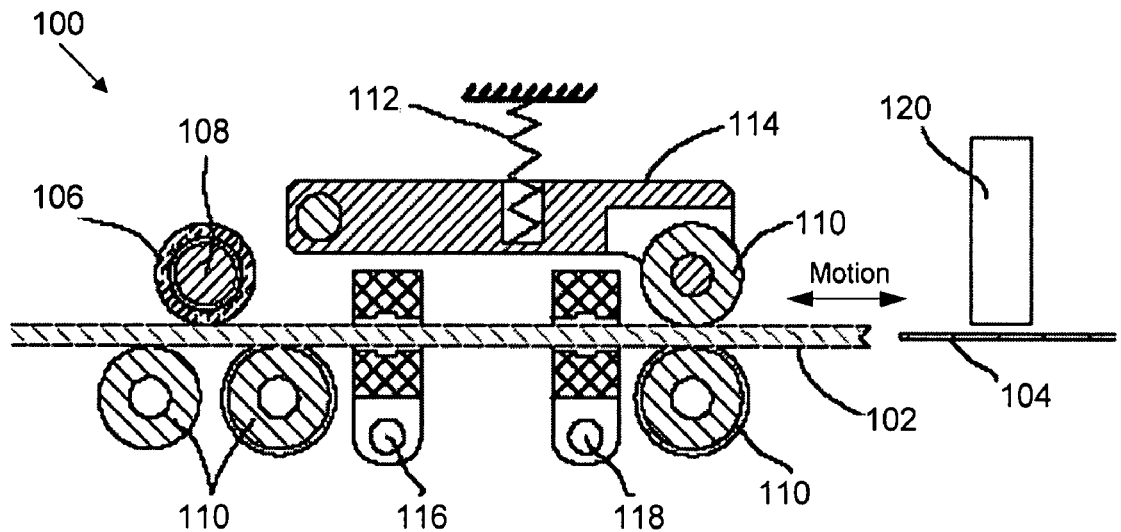
FIG. 1 is a schematic side view of a prior art ejector system.
Figure 2:
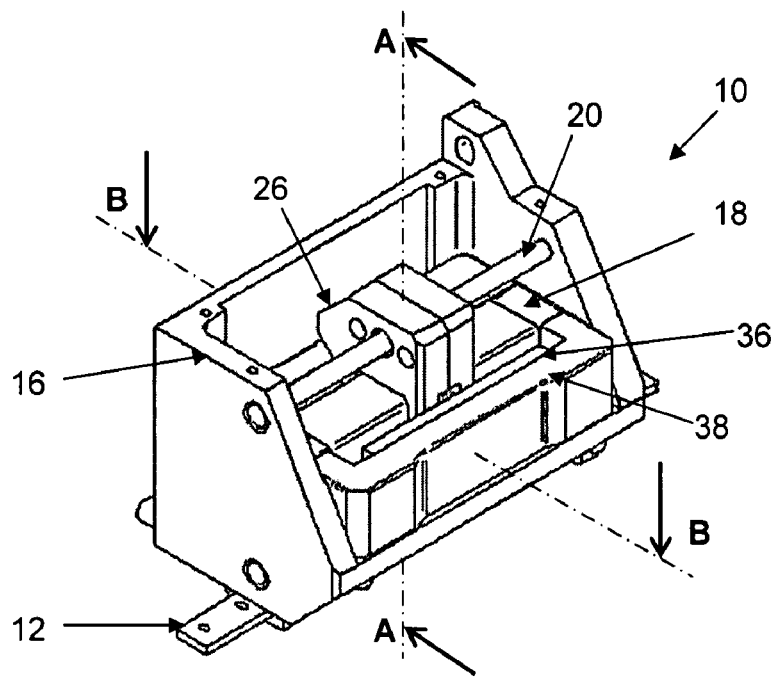
FIG. 2 is an isometric view of an ejector system comprising a linear actuator in accordance with the preferred embodiment of the invention.
Figure 3:
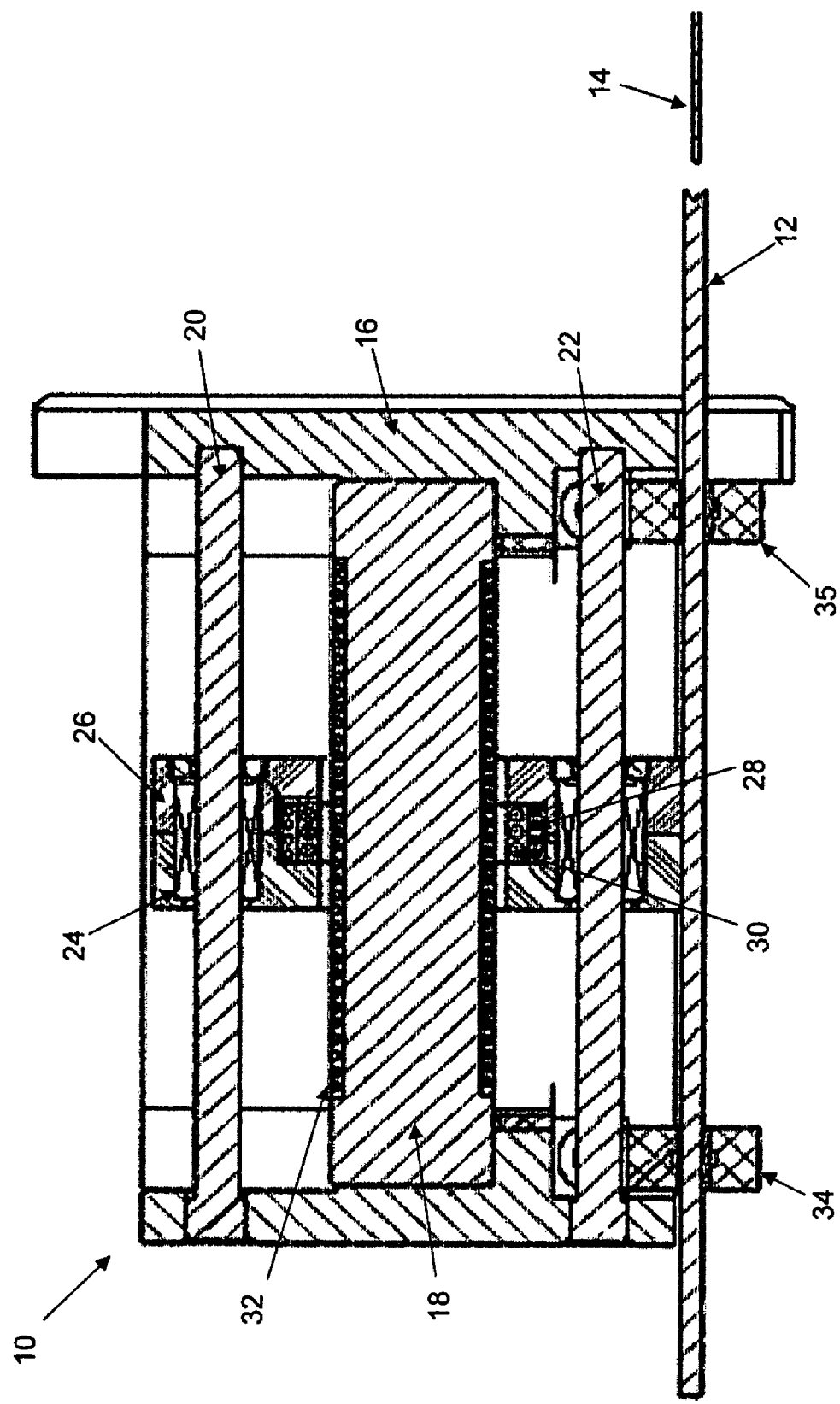
FIG. 3 is a schematic cross-sectional side view of the ejector system looking along sectional line A-A of FIG. 2.

The preferred embodiment of the present invention will be described with reference to FIGS. 2 and 3 in relation to an ejector system, although it should be appreciated that the invention is also applicable to other actuation systems. FIG. 2 is an isometric view of an ejector system 10 comprising a linear actuator in accordance with the preferred embodiment of the invention. FIG. 3 is a schematic cross-sectional side view of the ejector system looking along sectional line A-A of FIG. 2.

The ejector system 10 includes an actuation arm in the form of an ejector arm 12 for pushing an object, such as a leadframe 14. The ejector arm 12 is mounted onto a housing 16 and is configured to be slidable with respect thereto. The housing 16 houses components for driving the ejector arm 12 and for sensing a velocity at which the ejector arm 12 is driven.

The main component for driving the ejector arm 12 consists of a voice coil motor (VCM), which comprises a first coil, such as a movable motor coil 30, and magnets 36 that are arranged about a central yoke 18 that is oriented parallel to a direction of motion of the motor coil 30. The magnets 36 and central yoke 18 produce a magnetic field such that the motor coil 30 is controllably movable within the magnetic field by adjusting a current flowing through the motor coil 30. The ejector arm 12 is attached rigidly to the movable motor coil 30 via a bracket 26 such that movement of the motor coil 30 will drive the ejector arm 12 to move with respect to the housing 16.

A velocity sensor is also coupled to the motor coil 30 and bracket 26. The velocity sensor preferably comprises at least a second coil, such as a sensor coil 28, and a third coil, such as a compensation coil 32, which are arranged to interact electromagnetically with the magnets 36. The sensor coil 28 is movable with the motor coil 30 and is configured such that a voltage is inducible in the sensor coil 28 that is nominally proportional to its velocity. The sensor coil 28 may be disposed in the same magnetic field as the motor coil 30 for electromagnetic interaction, but it would also be disposed in a separate magnetic field by locating it away from the motor coil 30. In the former set-up, the sensor coil 28 is preferably wound on top of the motor coil 30, as in the present embodiment.

The motor coil 30, sensor coil 28 and bracket 26 are movable as one unit relative to the central yoke 18. To facilitate movement by these components relative to the central yoke 18, the bracket 26 includes linear bearings that are mounted onto two shafts 20, 22 which are arranged to extend in directions parallel to the central yoke 18, and therefore to a direction of motion of the motor coil 30. The linear bearings 24 allow the bracket 26 to be slidable with respect to the shafts 20, 22 and help to provide smooth and precise linear motion to the bracket 26.

The ejector arm 12 initially rests at a home or retracted position. When activated, it is extended from the housing 16 in the direction of the leadframe 14 to push the leadframe 14 until it reaches a predetermined extension limit. A home sensor 34 and a limit sensor 35 positioned adjacent to the ejector arm 12 detect reference indicia formed on the ejector arm 12 so as to determine a position of the ejector arm 12, especially to determine when a fully retracted position and a fully extended position respectively are reached. The home and limit sensors 34, 35 are useful for system initialization and motion identification.

When the VCM (comprising the motor coil 30 and magnets 36) actuates the ejector arm 12 to push the leadframe 14, the velocity sensor (comprising the sensor coil 28, compensation coil 32 and magnets 36) senses the speed and direction of the motion. Electrical signals relating to the speed and direction of motion of the ejector arm 12 are continuously monitored to establish a velocity-based closed loop control to ensure that the ejector system 10 tracks a pre-specified velocity profile. The velocity profile is field-programmable to suit different leadframes 14. Any undesired disturbance to the moving leadframe 14 results in a change of motor current, as will be explained in further detail below. Once the current exceeds a predefined threshold, the ejector system 10 may determine that movement of the ejector arm 12 has been obstructed and a leadframe jam has been encountered. Any current that exceeds the pre-defined threshold during acceleration and deceleration is programmed to be as short as possible so that it may be simply excluded when determining whether there has been a leadframe jam.

Figure 4:
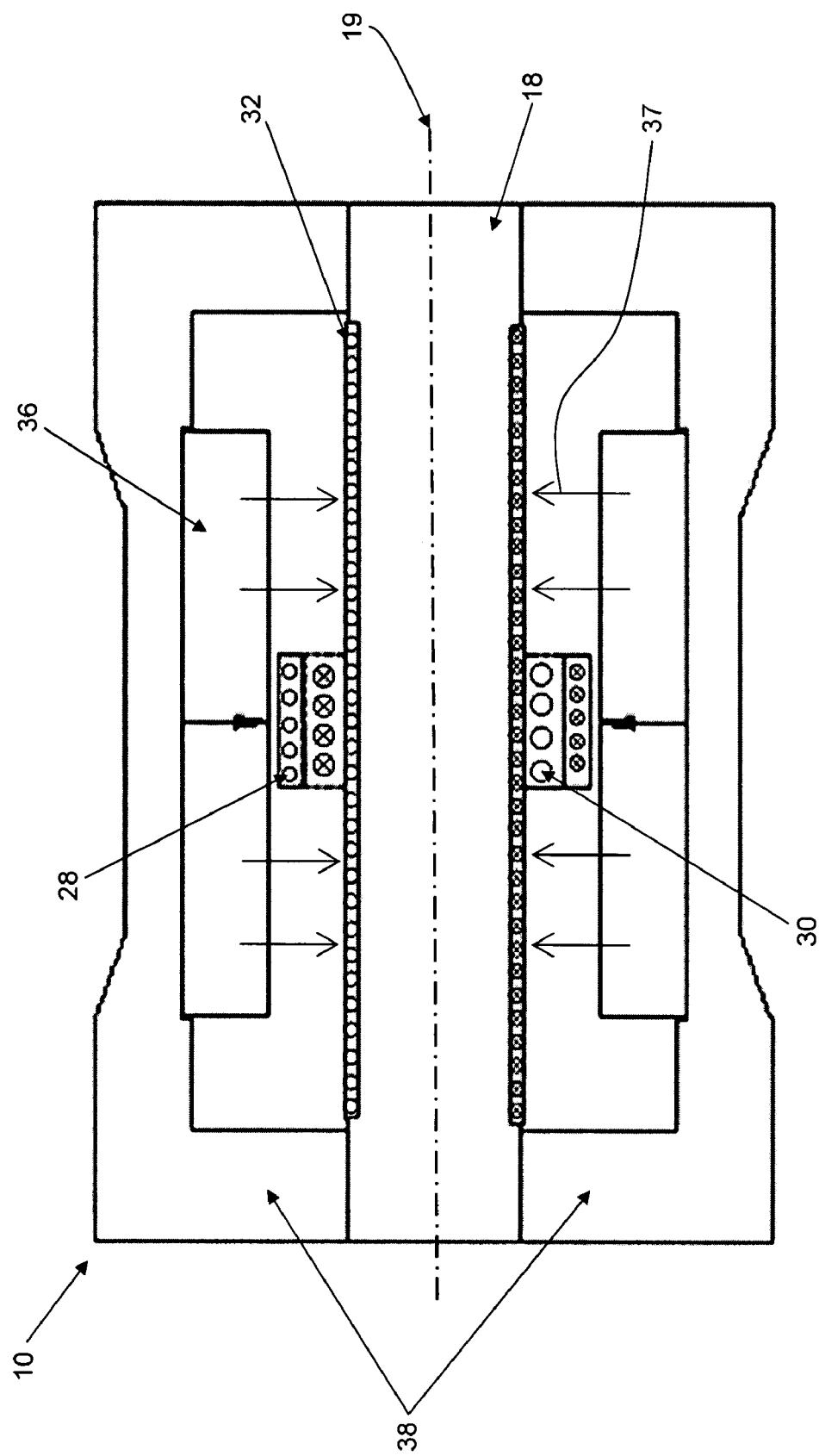
FIG. 4 is a schematic cross-sectional plan view of the ejector system looking along sectional line B-B of FIG. 2.

FIG. 4 is a schematic cross-sectional plan view of the ejector system 10 looking along sectional line B-B of FIG. 2. For simplicity, the housing 16 of the ejector system 10 is not shown. The drawing shows a cross-sectional view of a VCM configuration that is adopted with due regard to the maximum travel requirement in the present application. It should be appreciated that the VCM configuration may vary with different travel requirements.

FIG. 4 shows a pair of rectangular box magnets 36 mounted on back yokes 38 that are arranged with the indicated polarities. The back yokes 38 are affixed symmetrically on opposite sides of the central yoke 18 for mounting the magnets 36. This arrangement of the back yokes 38 and the central yoke 18 in between generates uniform magnetic fields 37 of nominally equal intensities between each magnet 36 and the central yoke 18, so that the respective motor coil 30 and sensor coil 28 experience a uniform magnetic field intensity while moving within the magnetic fields.

When the motor coil 30 of the VCM is energized by an electric current, a Lorentz force directly proportional to the size of the electric current is generated in a direction nominally parallel to and co-linear with a longitudinal axis 19 of the central yoke 18. Reversing the direction of the electric current in the motor coil 30 reverses the direction of the Lorentz force.

The velocity sensor preferably uses the same magnetic as well as mechanical configuration as the VCM. The sensor coil 28 is directly wound on top of the motor coil 30 and moves together with the motor coil 30. Therefore, when motion of the motor coil 30 is actuated by the VCM, a back-EMF is induced in the sensor coil 28, which is directly proportional to the velocity of the motion. This allows the velocity of motion of the ejector arm 12 to be determined.

At the same time, an undesirable transformer voltage is also induced in the sensor coil 28 on account of its close magnetic coupling with the motor coil 30, especially when the motor coil 30 is energized by a chopping current. Thus, the compensation coil 32 has been incorporated in the preferred embodiment of the invention to minimize the electromagnetic disturbances from the motor coil 30. As shown in FIG. 3 and FIG. 4, the compensation coil 32 is stationary and is preferably wound on the central yoke 18. In this embodiment, the compensation coil 32 is disposed in the same magnetic field as the sensor coil 28 and motor coil 30. It is electrically connected with the sensor coil 28 in anti-series so that transformer voltages induced in both the sensor coil 28 and the compensation coil 32 cancel out each other. Full cancellation of the induced voltages is hard to achieve due to variations in the magnetic field induced by the motor coil 30 and the saturation level in the central yoke 18 along the travel path of the motor coil 32. Incorporation of a low pass filter is therefore desirable to suppress spikes and extract only the usable velocity information that is detected.

FIG. 5 is a schematic control diagram showing a control system for the linear actuator. The control system generally comprises a controller device, which may include a microcontroller 40 and a proportional-integral (PI) controller 42, a voice coil motor module 44 and a velocity sensor module 46. Inputs that are received by the microcontroller 40 include a trigger input 48, home sensor input 50, limit sensor input 52, velocity setting input 54 and jam threshold input 56. A communications port 58 may also be included to establish communications between the microcontroller 40 and other devices.

The controller device is connected to the sensor coil 28, as represented by the velocity sensor module 46, for receiving feedback $V_{feedback}$ indicating a voltage induced in the sensor coil 28 whereby the velocity of the ejector arm 12 is determinable. The controller device is further connected to the motor coil 30, as represented by the voice coil motor module 44, and is operative to adjust the current flowing in the motor coil 30 through current signals $I_{cmd}(t)$ based upon said feedback for controllably driving the ejector arm 12 according to a predetermined reference velocity profile that is preset.

According to the preset reference velocity profile, a velocity command $V_{cmd}(t)$ is sent by the microcontroller 40 to the PI controller 42, which in turn sends a current signal $I_{cmd}(t)$ to initiate the voice coil motor module 44 to drive the VCM. As the ejector arm 12 is driven, the velocity sensor module 46 senses the velocity at which the ejector arm 12 moves. A velocity loop is facilitated by the velocity sensor module 46 sending velocity feedback $V_{feedback}$ in the form of the voltage induced in the sensor coil 28 to the microcontroller 40 to track the reference velocity command $V_{cmd}(t)$ and maintain the specified velocity profile. Motor current that is sensed, $I_{feedback}$, is also fed back to the microcontroller 40 for jam detection. Velocity fluctuations should result in quick changes to the motor current signal $I_{cmd}(t)$ to correct the velocity error. Once the detected motor current $I_{feedback}$ exceeds a certain value, leadframe jam is presumed. However, since it is likely that the current feedback signal will exceed the predefined threshold during acceleration and deceleration of the ejector arm 12, the control system automatically pre-empts and excludes jam triggers during acceleration and deceleration comprising current increases that are of comparatively short durations. The predefined reference velocity and jam thresholds are preferably programmable to cater for different situations.

FIG. 6 is a graphical illustration of a jam detection and leadframe protection process of the ejector system 10 of FIG. 2. The graphs include a reference velocity graph 60, a velocity sensor output graph 62 and detected motor current graph 64. The values shown are negative due to a relative driving direction initiated by the VCM, but the values may also be positive, the primary reference being the absolute values. The relative driving direction does not affect implementation of the preferred embodiment.

The ejector system 10 preferably operates in a controlled velocity loop with a trapezoidal reference velocity profile through control by the controller device of the current flowing through the motor coil 30, and it tries to maintain this profile during its operation. When no jam occurs as in FIG. 6(a), the cruising motor current is small (about 240 mA) since the moving components only need to overcome friction during constant velocity motion. Troughs in the velocity graphs 60, 62 show when the ejector arm 12 is traveling at constant velocity in the direction of the leadframe 14. Peaks and troughs in the motor current graph 64 represent current increases to accelerate and decelerate the ejector arm 12.

FIG. 6(b) includes an illustration of a jam profile 66 between times $t_1$ and $t_2$. Once there is an obstruction to movement of the ejector arm 12 and a jam is encountered, the absolute current in the motor current graph 64 increases rapidly (to about 1.6 A), which exceeds a predefined protection threshold which is set according to the characteristics of the leadframe 14 in use. The motor current exceeds the predefined protection threshold for the duration $t_2-t_1$. This duration is longer than that which is expected during acceleration and deceleration of the ejector arm 12. As a result, the system determines that there has been a leadframe jam. Accordingly, the ejector system 10 can be stopped and remedial action taken.

Alternatively, since the velocity sensed by the sensor coil 28 is significantly reduced when movement of the ejector arm 12 is obstructed, the ejector system 10 can be programmed such that the controller device is configured to detect when a velocity of the ejector arm 12 is below a predetermined threshold for a certain period of time as illustrated in the velocity graph 60 between $t_1$ and $t_2$. If so, this may also indicate an obstruction to movement of the ejector arm 12 and appropriate remedial action can be taken.

The leadframe ejector system 10 using the linear actuator comprising a built-in velocity sensor as described in the above embodiment of the invention enables both the VCM and velocity sensor to share similar magnetic and mechanical components. A compensation scheme has also been implemented to enhance the sensing quality of the velocity sensor, which is very important to automatic jam detection and leadframe protection. With this design, automatic leadframe jam detection can be achieved without having to implement an external feedback device, which would increase costs significantly. Since the current threshold is software-programmable, the system can cater to different leadframes in use.

Tests using the described embodiment show excellent velocity characteristics of the velocity sensor as well as adequately sensitive and reliable jam detection and leadframe protection capabilities for different types of leadframes.

The invention described herein is susceptible to variations, modifications and/or additions other than those specifically described and it is to be understood that the invention includes all such variations, modifications and/or additions which fall within the spirit and scope of the above description.

The invention claimed is:

1. A linear actuator for driving an actuation arm comprising:
   a magnetic field;
   a first coil that is controllably movable within the magnetic field by adjusting a current flowing through the first coil whereby to drive the actuation arm;
   a second coil that is movable with the first coil and configured such that a voltage is inducible in the second coil that is proportional to its velocity;
   a third coil that is configured to induce a transformer voltage that is opposite to a transformer voltage induced in the second coil when the first coil is carrying a current, wherein the third coil is stationary and is wound on a central yoke about which the first and second coils are arranged; and a controller device connected to the second coil for receiving feedback indicating the voltage induced in the second coil whereby a velocity of the actuation arm is determinable, wherein the controller device is further connected to the first coil and is operative to adjust the current flowing in the first coil based upon said feedback for controllably driving the actuation arm.

2. The linear actuator as claimed in claim 1, wherein the central yoke is oriented parallel to a direction of motion of the first coil, and magnets are arranged about the central yoke for producing the magnetic field.

3. The linear actuator as claimed in claim 2, including back yokes that are symmetrically arranged on opposite sides of the central yoke for mounting the magnets.

4. The linear actuator as claimed in claim 1, wherein the first and second coils are disposed in the same magnetic field for electromagnetic interaction.

5. The linear actuator as claimed in claim 3, wherein the second coil is wound on top of the first coil.

6. The linear actuator as claimed in claim 1, including a bracket comprising a linear bearing for mounting at least the first coil and the actuation arm, wherein the linear bearing is mounted on a shaft that is arranged parallel to a direction of motion of the first coil.

7. The linear actuator as claimed in claim 1, wherein the third coil is electrically connected to the second coil in anti-series.

8. The linear actuator as claimed in claim 1, wherein the first and third coils are disposed in the same magnetic field.

9. The linear actuator as claimed in claim 1, wherein the controller device is configured to detect when the current in the first coil exceeds a predetermined threshold limit whereby to indicate an obstruction to movement of the actuation arm.

10. The linear actuator as claimed in claim 1, wherein the controller device is configured to detect when a velocity of the actuation arm is below a predetermined threshold limit whereby to indicate an obstruction to movement of the actuation arm.

11. The linear actuator as claimed in claim 1, wherein the controller device is configured to control current flowing in the first coil such that movement of the first coil tracks a predetermined velocity profile.

12. The linear actuator as claimed in claim 1, wherein the controller device comprises a microcontroller and a proportional-integral controller.

13. The linear actuator as claimed in claim 1, wherein the actuation arm comprises an ejector arm that is configured and arranged to push a semiconductor device positioned along a path that the ejector arm is driven.

* * * * *